(12) United States Patent
Kitao et al.

(10) Patent No.: US 7,501,885 B2
(45) Date of Patent: Mar. 10, 2009

(54) FILTER CIRCUIT

(75) Inventors: Norio Kitao, Shinshiro (JP); Junji Hayakawa, Okazaki (JP)

(73) Assignee: DENSO CORPORATION, Kariya (JP)

( * ) Notice: Subject to any disclaimer, the term of this patent is extended or adjusted under 35 U.S.C. 154(b) by 14 days.

(21) Appl. No.: 11/717,024

(22) Filed: Mar. 13, 2007

(65) Prior Publication Data

US 2007/0216474 A1  Sep. 20, 2007

(30) Foreign Application Priority Data

Mar. 15, 2006  (JP)  ............................. 2006-070241

(51) Int. Cl.
*H03K 5/00* (2006.01)

(52) U.S. Cl. .................. 327/554; 327/552; 327/531

(58) Field of Classification Search ......... 327/551–559, 327/94; 330/9

See application file for complete search history.

(56) References Cited

U.S. PATENT DOCUMENTS

| | | | | |
|---|---|---|---|---|
| 4,739,189 A | * | 4/1988 | Kellogg | 327/555 |
| 5,434,535 A | * | 7/1995 | Tomasini et al. | 327/552 |
| 6,346,854 B1 | * | 2/2002 | Heithoff | 330/149 |
| 6,483,322 B2 | | 11/2002 | Aoyama et al. | |
| 6,784,728 B2 | * | 8/2004 | Fischer | 327/554 |
| 6,975,845 B2 | * | 12/2005 | Vihonen et al. | 455/249.1 |
| 7,339,420 B2 | * | 3/2008 | Maeda | 327/554 |

\* cited by examiner

*Primary Examiner*—Dinh T. Le
(74) *Attorney, Agent, or Firm*—Posz Law Group, PLC (57) ABSTRACT

A filter circuit includes a voltage amplifier, a resistor, a capacitor, and an analog switch connected between the voltage amplifier and the capacitor. When the voltage amplifier is turned on, the analog switch is opened so that the capacitor is disconnected from the voltage amplifier. Thus, an output voltage of the voltage amplifier sharply increases to its steady state value, as soon as the voltage amplifier is turned on. When the output voltage of the voltage amplifier is fully stabilized, the analog switch is closed so that the capacitor is connected to the voltage amplifier. During the period of time when the analog switch is closed, the filter circuit is configured as an imperfect integrator circuit with filter characteristics that depend on a capacitance of the capacitor and a resistance of the resistor.

8 Claims, 12 Drawing Sheets

FILTER CIRCUIT

CROSS REFERENCE TO RELATED APPLICATION

This application is based on and incorporates herein by reference Japanese Patent Application No. 2006-70241 filed on Mar. 15, 2006.

FIELD OF THE INVENTION

The present invention relates generally to filter circuits, and, in particular, to an analog active filter circuit.

BACKGROUND OF THE INVENTION

A switched capacitor filter (SFC) circuit is a filter circuit having a low cutoff frequency. The SFC circuit has a simple structure and consists of an analog switch, a capacitor, and an operational amplifier (op-amp). Therefore, the SFC circuit is suitable for use in a signal processing circuit integrated on one chip as a monolithic integrated circuit (IC).

For example, a capacitive physical quantity sensor disclosed in U.S. Pat. No. 6,483,322 by the present applicant includes a SFC circuit incorporated in a signal processing circuit that processes an output voltage of a capacitance-to-voltage converter and outputs a signal corresponding to a change in physical quantity. The SFC circuit eliminates harmonic noise from the output voltage of the capacitance-to-voltage converter.

Since a SFC circuit achieves predetermined filter characteristics by switching an analog switch, the switched capacitor filter circuit may produce harmonic noise, i.e., switching noise. Therefore, a low pass filter circuit is generally added to an output of the SFC circuit to eliminate the switching noise from an output signal of the SFC circuit.

Typically, the low pass filter circuit is implemented by an analog active filter circuit, because the analog active filter circuit does not produce the switching noise. Further, the use of the analog active filter circuit allows the monolithic IC chip to be compact.

An analog active filter includes a capacitor and a resistor. The rise time of an output signal of the analog active filter circuit is determined by a time constant depending on capacitance of the capacitor and resistance of the resistor. There is a delay time between when a power supply of the analog active filter circuit is turned on and when the output signal of the analog active filter circuit reaches its final value. Therefore, the analog active filter circuit cannot be used in applications that require fast start-up operation or fast intermittent operation where the power supply is repeatedly turned on and off at very short intervals.

SUMMARY OF THE INVENTION

In view of the above-described problem, it is an object of the present invention to provide a filter circuit having a reduced rise time so that an output signal of the filter circuit reaches its steady state value immediately after the filter circuit is tuned on.

A filter circuit includes a voltage amplifier, a resistor, a capacitor, and an analog switch connected between the voltage amplifier and the capacitor. The voltage amplifier is repeatedly tuned on and off so that the filter circuit operates intermittently.

When the voltage amplifier is turned on, the analog switch is opened so that the capacitor is disconnected from the voltage amplifier. Then, when an output voltage of the voltage amplifier is fully stabilized, the analog switch is closed so that the capacitor is connected to the voltage amplifier. Then, when the voltage amplifier is turned off, the analog switch is opened so that the capacitor is disconnected from the voltage amplifier. During the period of time when the analog switch is closed, the filter circuit has filter characteristics that depend on a capacitance of the capacitor and a resistance of the resistor.

The capacitor is disconnected from the voltage amplifier by the analog switch, when the voltage amplifier is turned on. In such an approach, the output voltage of the voltage amplifier sharply increases to its steady state value, as soon as the voltage amplifier is turned on. Therefore, the filter circuit can be used even in applications that require fast start-up operation or fast intermittent operation where the voltage amplifier is repeatedly turned on and off at very short intervals.

The capacitor is disconnected from the voltage amplifier by the analog switch, when the voltage amplifier is turned off. In such an approach, the capacitor is still almost fully charged, when the voltage amplifier is turned on again. Therefore, a charging current flowing when the capacitor is charged for the second and subsequent times is much smaller than a charging current flowing when the capacitor is charged for the first time. Accordingly, a consumption current consumed in the filter circuit is reduced. Therefore, the filter circuit can be used in applications that require low-power consumption.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
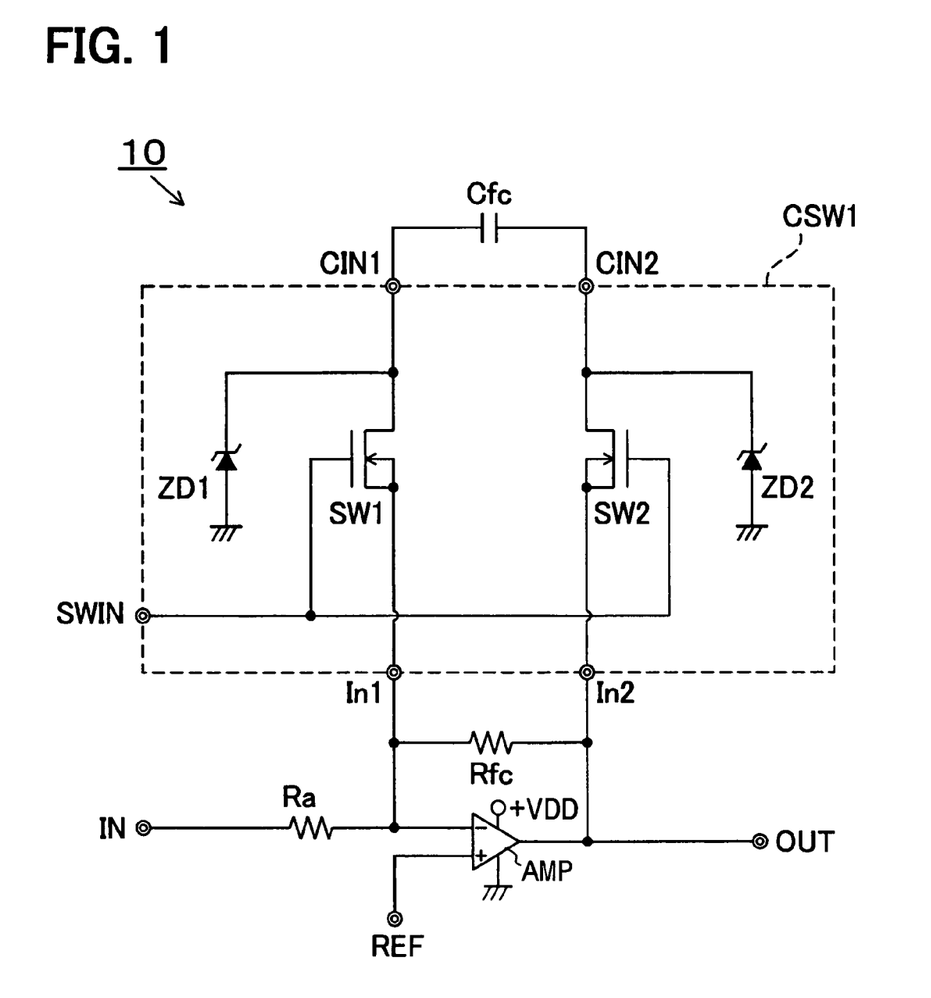
FIG. 1 is a schematic diagram of a first-order low pass filter circuit according to a first embodiment of the present invention.

As shown in FIG. 1, a first-order low pass filter circuit 10 according to the first embodiment of the present invention includes an operational amplifier (op-amp) AMP, an input terminal IN, an output terminal OUT, a terminal REF, resistors Ra, Rfc, a capacitor Cfc, and a block CSW1. The block CSW1 includes two n-channel metal oxide semiconductor (MOS) transistors SW1, SW2, two zener diodes ZD1, ZD2, and five terminals CIN1, CIN2, In1, In2, and SWIN. The filter circuit 10 is integrated on one semiconductor chip as a monolithic integrated circuit (IC).

The op-amp. AMP is connected to a positive single power supply providing a positive supply voltage +VDD with respect to ground. The inverting input of the op-amp AMP is connected to the input terminal IN through the resistor Ra and connected to the output of the op-amp AMP through the resistor Rfc. The output of the op-amp AMP is connected to the output terminal OUT. The non-inverting input of the op-amp AMP is connected to the terminal REF. A midpoint voltage +VDD/2 equal to one half the supply voltage +VDD is applied to the terminal REF.

Each of the gates of the transistors SW1, SW2 is connected to the terminal SWIN. A control signal is applied to the terminal SWIN. When the control signal is high, each of the transistors SW1, SW2 is turned on. When the control signal is low, each of the transistors SW1, SW2 is turned off. Thus, each of the transistors SW1, SW2 acts as a switch that is tuned on and off in accordance with the level of the control signal.

The source of the transistor SW1 is connected to the inverting input of the op-amp AMP through the terminal In1. The drain of the transistor SW1 is connected to the cathode of the zener diode ZD1 and connected to a first electrode of the capacitor Cfc through the terminal CIN1. The anode of the zener diode ZD1 is connected to the ground. Thus, the zener diode ZD1 is connected between the drain of the transistor SW1 and the ground in a reverse biased manner.

In the transistor SW1, the p-type substrate body is connected to the source so that the body voltage is equal to the source voltage.

The source of the transistor SW2 is connected to the output of the op-amp AMP through the terminal In2. The drain of the transistor SW2 is connected to the cathode of the zener diode ZD2 and connected to a second electrode of the capacitor Cfc through the terminal CIN2. Thus, the capacitor Cfc is connected between the drains of the transistors SW1, SW2. The anode of the zener diode ZD2 is connected to the ground.

Thus, the zener diode ZD2 is connected between the drain of the transistor SW2 and the ground in the reverse biased manner.

In the transistor SW2, the p-type substrate body is connected to the source so that the body voltage is equal to the source voltage.

Figure 2:
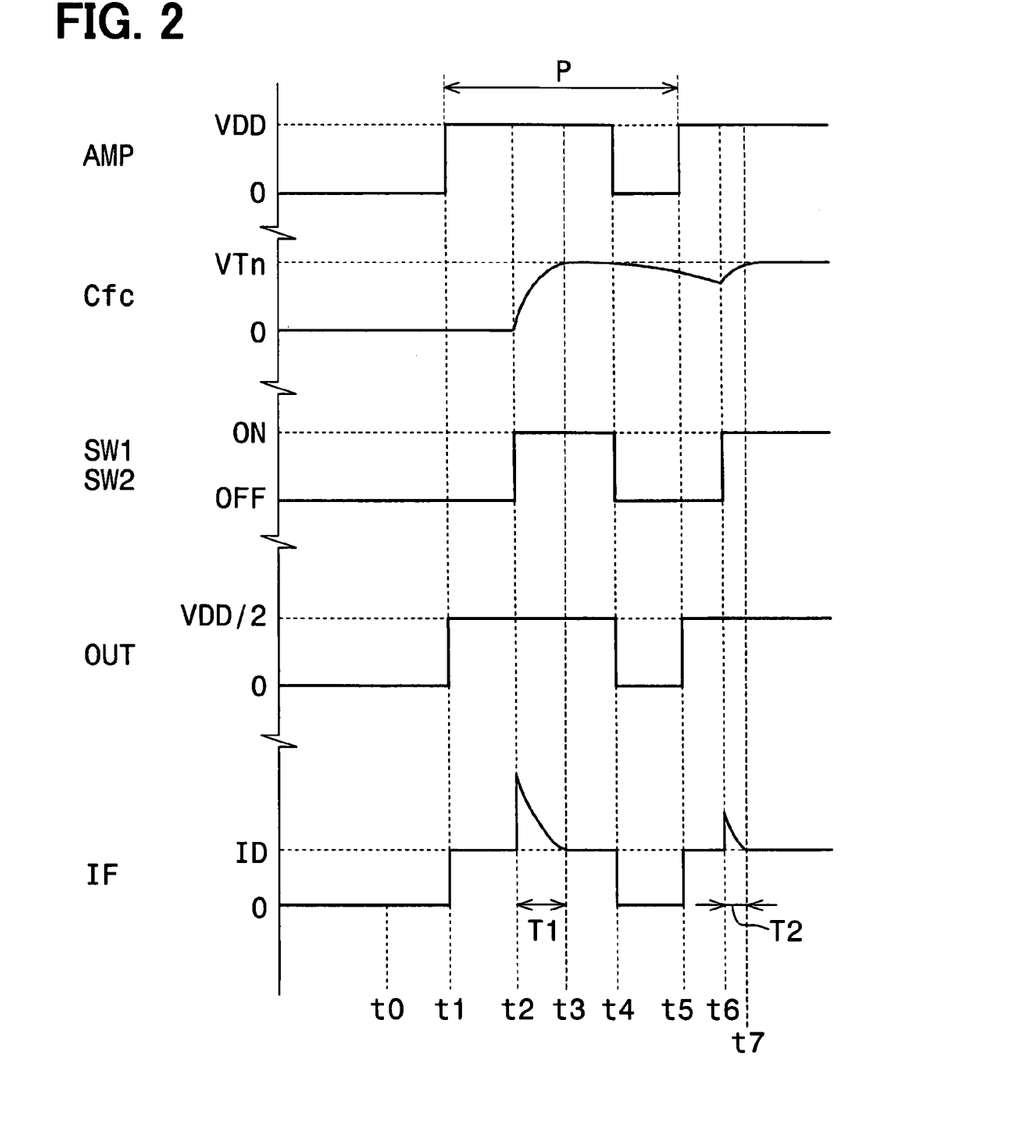
FIG. 2 is a timing chart of an operation of the first-order low pass filter circuit of FIG. 1.
Figure 3:
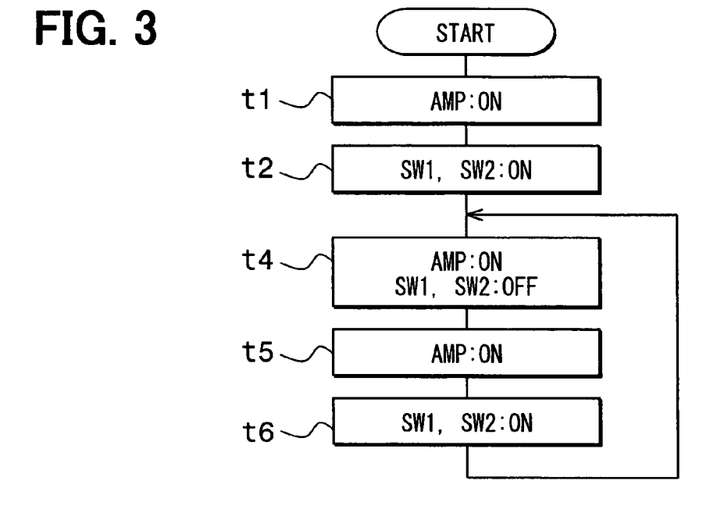
FIG. 3 is a flow chart of the operation of the first-order low pass filter circuit of FIG. 1.

The filter circuit 10 operates intermittently as shown in FIGS. 2 and 3.

At a time t0, the filter circuit 10 is in its initial state. In the initial state, the power supply of the op-amp AMP is off, the supply voltage +VDD to the op-amp AMP is interrupted, a voltage of the capacitor Cfc is zero, the transistors SW1, SW2 are off, a voltage of the output terminal OUT is zero, and a current Ic consumed in the filter circuit 10 is zero. In the initial state, therefore, the capacitor Cfc is fully discharged, i.e., the capacitor Cfc has no charge.

At a time t1, the power supply of the op-amp AMP is turned on for the first time and the supply voltage +VDD is applied to the op-amp AMP. The switches SW1, SW2 remains off at the time t1. Therefore, the voltage of the capacitor Cfc remains zero at the time t1.

The op-amp AMP acts as an inverting amplifier so that the voltage of the output terminal OUT sharply increases to a predetermined steady state value that depends on resistances of the resistor Ra, Rfc, and voltages applied to the terminals IN, REF. In the first embodiment, the steady state value is set to the midpoint voltage +VDD/2. Therefore, as soon as the supply voltage +VDD is applied to the op-amp AMP, the voltage of the output terminal OUT increases to the midpoint voltage +VDD/2. The consumption current IF reaches a predetermined constant value ID required for the op-amp AMP to work properly.

At a time t2, the voltage of the output terminal OUT is fully stabilized and each of the transistors SW1, SW2 is turned on for the first time. Then, a charging current flows into the capacitor Cfc via the transistors SW1, SW2. The capacitor Cfc is gradually charged to a constant voltage VTn at a rate determined by a time constant that depends on a capacitance of the capacitor Cfc and the resistances of the resistors Ra, Rfc.

When the transistors SW1, SW2 are tuned on, the capacitor Cfc is connected between the inverting input and the output of the op-amp AMP. Thus, the filter circuit 10 is configured as an imperfect integrator circuit with low pass filter characteristics that depend on the capacitance of the capacitor Cfc and the resistances of the resistors Ra, Rfc.

The consumption current IF changes with a change in the charging current. Specifically, the consumption current IF increases at the time t2 when the charging current starts to flow into the capacitor Cfc. As the capacitor Cfc is charged, the consumption current Ic decreases.

At a time t3, the capacitor Cfc is fully charged to the constant voltage VTn and the consumption current IF returns to the constant value ID.

At a time t4, the power supply of the op-amp AMP is turned off so that the supply voltage +VDD to the op-amp AMP is interrupted. At the same time, the transistors SW1, SW2 are turned off. Then, a discharging current flows out of the capacitor Cfc and the capacitor Cfc is discharged. As a result, the voltage of the capacitor Cfc gradually decreases.

Since the transistors SW1, SW2 are turned off, the op-amp AMP is disconnected from the capacitor Cfc. As a result, the voltage of the output terminal OUT sharply decreases to zero and the consumption current IF also decreases to zero.

At a time t5, the power supply of the op-amp AMP is turned on for a second time and the supply voltage +VDD is applied to the op-amp AMP for the second time. The transistors SW1, SW2 remains off at the time t4 so that the op-amp AMP acts as the inverting amplifier. Therefore, the voltage of the output terminal OUT sharply increases to the midpoint voltage +VDD/2 and the consumption current IF becomes the constant value ID. Although the capacitor Cfc is discharged between the time t3 and the t4, the discharging current is very small. Therefore, the voltage of the capacitor Cfc at the time t5 is almost equal to the voltage of the capacitor Cfc at the time t4, as long as the period of time between the time t4 and the time t5 is short.

At a time t6, the voltage of the output terminal OUT is fully stabilized and each of the transistors SW1, SW2 is turned on for the second time. Then, the charging current flows into the capacitor Cfc via the transistors SW1, SW2. The capacitor Cfc is gradually charged to the constant voltage VTn at the rate determined by the time constant that depends on the capacitance of the capacitor Cfc and the resistances of the resistors Ra, Rfc.

At a time t7, the capacitor Cfc is fully charged to the constant voltage VTn and the consumption current IF returns to the constant value ID. Although the capacitor Cfc is discharged between the time t4 and the time t6, the discharging current is very small. In short, the capacitor Cfc is still almost fully charged at the time t6. Therefore, the second charging time T2 between the time t6 and the time t7 is much shorter than the first charging time T1 between the time t2 and the time t3. Accordingly, the charging current flowing during the second charging time T2 is much small than the charging current flowing during the first charging time T1. Therefore, the change in the consumption current IF during the second charging time T2 is much smaller than the change in the consumption current IF during the first charging time T1.

Thus, the power supply of the op-amp AMP is repeatedly turned on and off at intervals P so that the filter circuit 10 operates intermittently.

Figure 4:
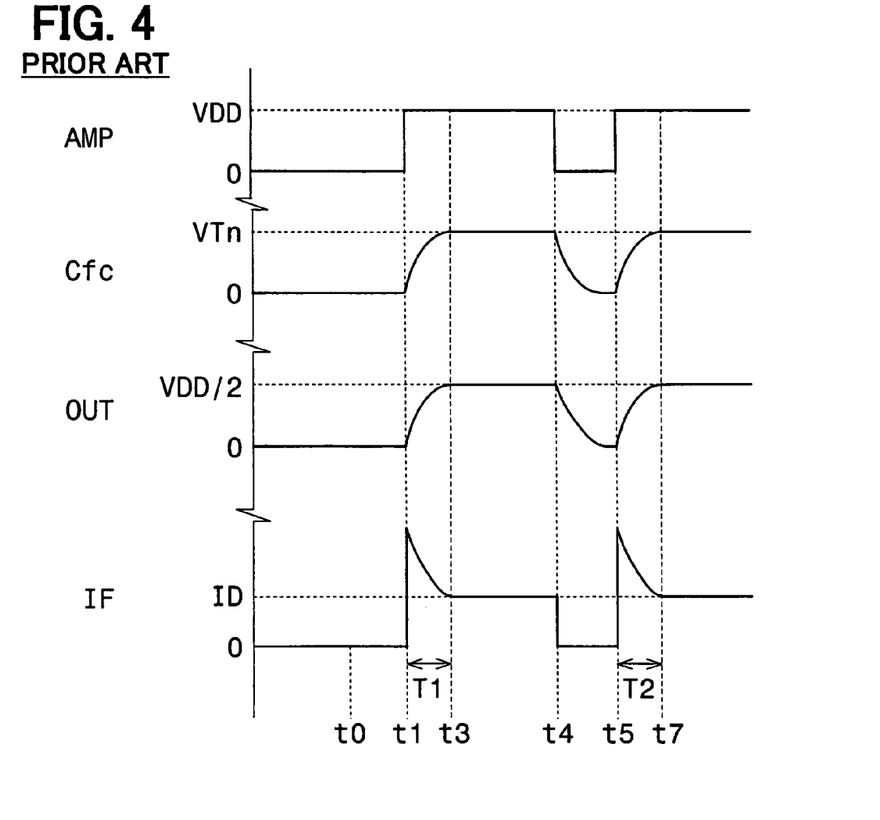
FIG. 4 is a timing chart of an operation of a conventional first-order low pass filter circuit.

In contrast, a conventional filter circuit operates intermittently as shown in FIG. 4. A difference between the filter circuit 10 and the conventional filter circuit is in that the conventional filter circuit does not has the block CSW1. In the conventional filter circuit, therefore, the capacitor Cfc is directly connected between the inverting input and the output of the op-amp AMP.

As shown in FIG. 4, at a time t1, the power supply of the op-amp AMP is tuned on for the first time and the supply voltage +VDD is applied to the op-amp AMP for the first time. At the same time, the charging current flows into the capacitor Cfc. Thus, the capacitor Cfc is gradually charged to the constant voltage VTn at the rate determined by the time constant that depends on the capacitance of the capacitor Cfc and the resistances of the resistors Ra, Rfc.

The consumption current IF changes with the change in the charging current. Specifically, the consumption current IF increases at the time t1 when the charging current starts to flow into the capacitor Cfc. As the capacitor Cfc is charged, the consumption current IF decreases.

At a time t3, the capacitor Cfc is fully charged to the constant voltage VTn and the consumption current IF becomes the constant value ID.

At a time t4, the power supply of the op-amp AMP is turned off so that the supply voltage +VDD to the op-amp AMP is interrupted. Then, the discharging current flows out of the capacitor Cfc and the capacitor Cfc is gradually discharged at the rate determined by the time constant that depends on the capacitance of the capacitor Cfc and the resistances of the resistors Ra, Rfc. The voltage of the capacitor Cfc decreases to zero in a short period of time. Accordingly, the voltage of the output of the op-amp AMP decreases to zero in the short period of time, because the op-amp AMP is connected to the capacitor Cfc.

At a time t5, the power supply of the op-amp AMP is turned on for the second time and the supply voltage +VDD is applied to the op-amp AMP for the second time. Then, the voltage of the capacitor Cfc, the voltage of the output terminal OUT, and the consumption current IF changes, as is the case when the power supply of the op-amp AMP is turned on for the first time.

In the conventional filter circuit, as described above, the rise time of the voltage of the output terminal OUT is determined by the time constant that depends on the capacitance of the capacitor Cfc and the resistances of the resistors Ra, Rfc. In other words, there is a turn-on delay time between when the power supply of the op-amp AMP is turned on and when the voltage of the output terminal OUT reaches the steady state value (i.e., VDD/2). Therefore, the conventional filter circuit cannot be used in applications that require fast start-up operation or fast intermittent operation where the power supply is repeatedly turned on and off at very short intervals.

In the filter circuit 10 according to the first embodiment, the transistors SW1, SW2 remain off to disconnect the op-amp AMP from the capacitor Cfc, when the power supply of the op-amp AMP is turned on. In such an approach, the voltage of the output terminal OUT sharply increases to the steady state value so that the turn-on delay time can be reduced. Therefore, the filter circuit 10 can be used even in the applications that require the fast start-up operation or the fast intermittent operation.

In the conventional filter circuit, as shown in FIG. 4, after the power supply of the op-amp AMP is turned off at the time t4, the capacitor Cfc is discharged at the rate determined by the time constant. As a result, the capacitor Cfc is almost fully discharged at the time t5 when the power supply of the op-amp AMP is turned on for the second time, even if the period of time between the time t4 and the time t5 is short. Therefore, the second charging time T2 between the time t5 and the time t7 is almost equal to the first charging time T1 between the time t1 and the time t3. Accordingly, the charging current flowing during the second charging time T2 is almost equal to the charging current flowing during the first charging time T1. Therefore, the change in the consumption current IF during the second charging time T2 is almost equal to the change in the consumption current IF during the first charging time T1.

In the filter circuit 10 according to the first embodiment, the transistors SW1, SW2 are turned off to disconnect the op-amp AMP from the capacitor Cfc, when the power supply of the op-amp AMP is turned off. Then, the transistors SW1, SW2 are turned on at the time t6 to charge the capacitor Cfc. In such an approach, as long as the period of time between the time t4 when the power supply of the op-amp AMP is tuned off and the time t6 when the switches SW1, SW2 are turned on is short, the capacitor Cfc is still almost fully charged at the time 6. Therefore, the charging current flowing during the second charging time T1 is much small than the charging current flowing during the first charging time T2. Accordingly, the change in the consumption current IF during the second charging time T2 is much smaller than the change in the consumption current IF during the first charging time T1. Thus, the filter circuit 10 can be used in applications that require low-power consumption.

In the filter circuit 10 according to the first embodiment, the zener diode ZD1 is connected between the drain of the transistor SW1 and the ground in the reverse biased manner. Therefore, the drain voltage (i.e., the voltage of the terminal CIN1) of the transistor SW1 is clamped to the zener voltage of the zener diode ZD1. Also, the zener diode ZD2 is connected between the drain of the transistor SW2 and the ground in the reverse biased manner. Therefore, the drain voltage (i.e., the voltage of the terminal CIN2) of the transistor SW2 is clamped to the zener voltage of the zener diode ZD2. In such an approach, even when the capacitor Cfc is overcharged, the drain voltages of the transistors SW1, SW2 are clamped to the zener voltages of the zener diodes ZD1, ZD2, respectively. Thus, the zener diodes ZD1, ZD2 protect the transistors SW1, SW2 from being destroyed by excessive voltage. The zener voltages of the zener diodes ZD1, ZD2 are set based on withstand voltages of the transistors SW1, SW2 so that the transistors SW1, SW2 can be surely protected.

In the filter circuit 10 according to the first embodiment, the op-amp AMP operates from the positive single supply voltage +VDD. Therefore, it is preferable that n-channel transistors are used as the transistors SW1, SW2. If p-channel transistors are used as the transistors SW1, SW2, the discharging current flows out of the capacitor Cfc even when the transistors SW1, SW2 are turned off.

Second Embodiment

Figure 5A:
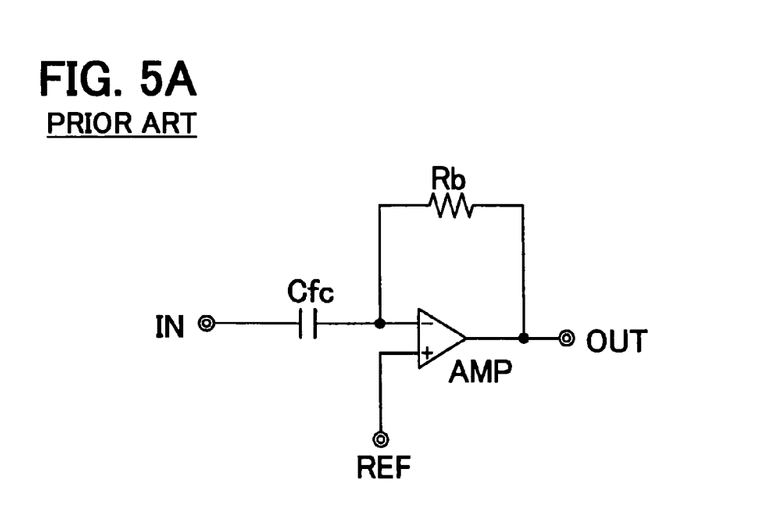
FIG. 5A is a schematic diagram of a conventional first-order high pass filter circuit.
Figure 5B:
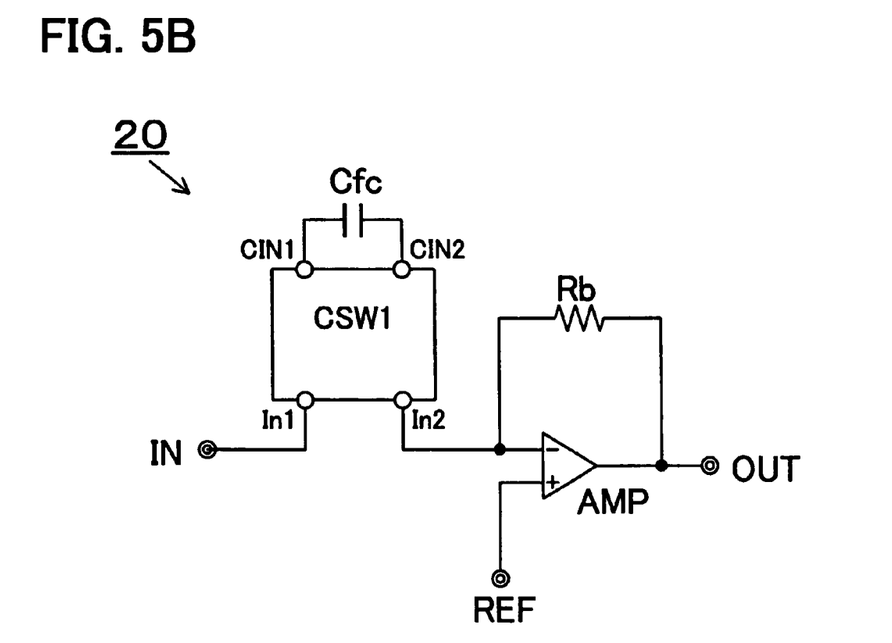
FIG. 5B is a schematic diagram of a first-order high pass filter circuit according to the second embodiment of the present invention.
Figure 6A:
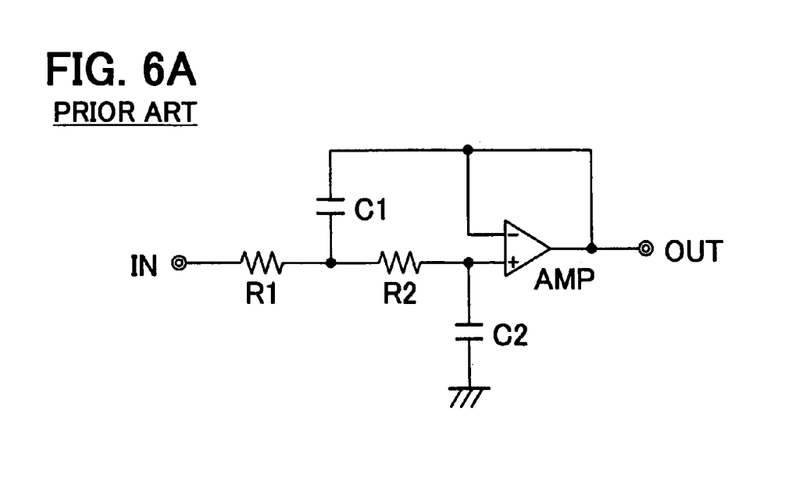
FIG. 6A is a schematic diagram of a conventional second-order low pass filter circuit.

As shown in FIG. 5B, a first-order high pass filter circuit 20 according to the second embodiment includes an op-amp AMP, the input terminal IN, the output terminal OUT, the terminal REF, a resistor Rb, the capacitor Cfc, and the block CSW1. A difference between the filter circuit 20 shown in FIG. 5B and a conventional first-order high pass filter circuit shown in FIG. 6A is in that the filter circuit 20 includes the block CSW1 connected to the capacitor Cfc. Like the first embodiment, the op-amp AMP operates from the single power supply voltage +VDD.

Third Embodiment

Figure 6B:
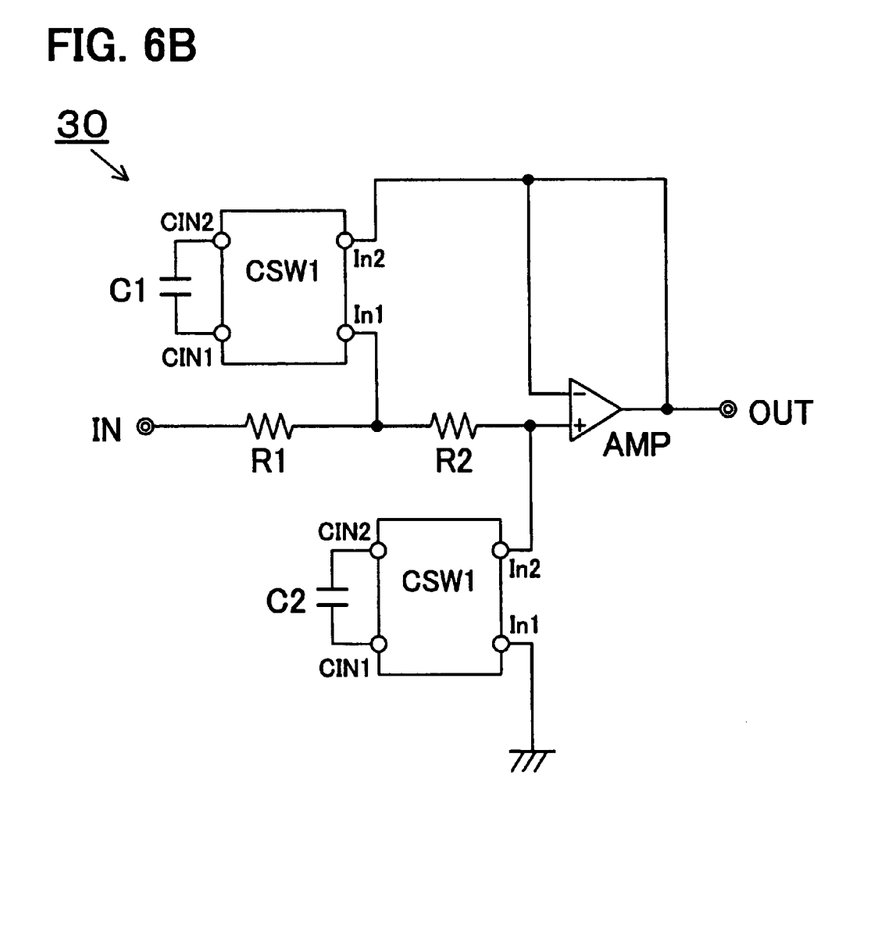
FIG. 6B is a schematic diagram of a second-order low pass filter circuit according to the third embodiment of the present invention.

As shown in FIG. 6B, a second-order low pass filter circuit 30 according to the third embodiment includes the op-amp AMP, the input terminal IN, the output terminal OUT, the terminal REF, resistors R1, R2, capacitors C1, Cs, and the blocks CSW1. A difference between the filter circuit 30 shown in FIG. 6B and a conventional second-order low pass filter circuit shown in FIG. 6A is in that the filter circuit 30 includes the blocks CSW1. One of the blocks CSW1 is connected to the capacitor C1 and the other of the blocks CSW1 is connected to the capacitor C2. Like the first embodiment, the op-amp AMP operates from the single power supply voltage +VDD.

Fourth Embodiment

Figure 7A:
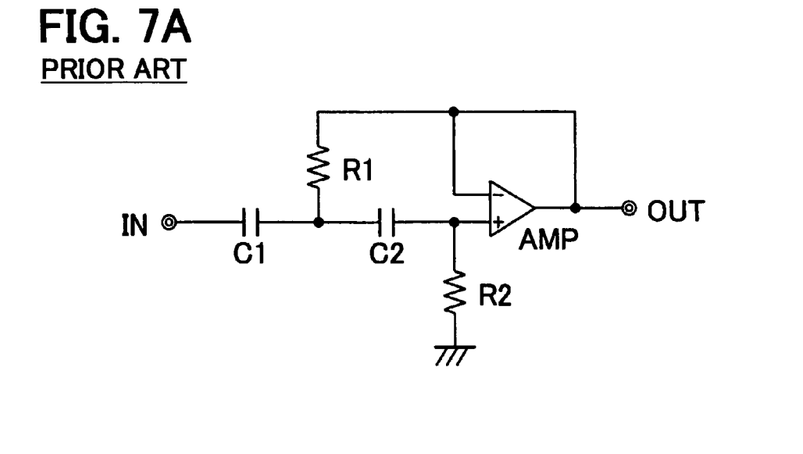
FIG. 7A is a schematic diagram of a conventional second-order high pass filter circuit.
Figure 7B:
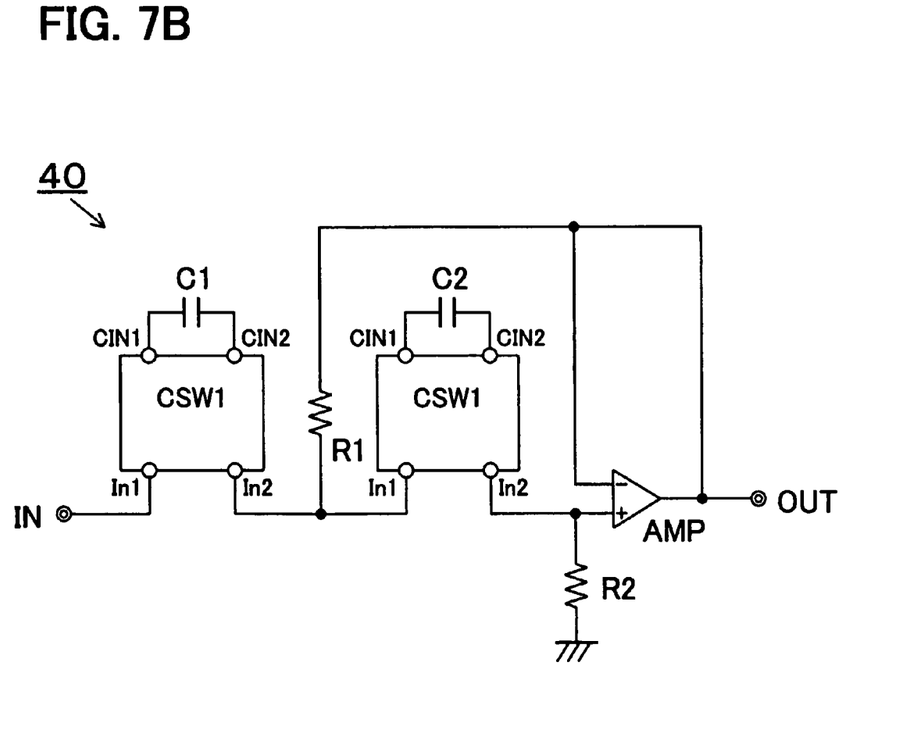
FIG. 7B is a schematic diagram of a second-order high pass filter circuit according to the fourth embodiment of the present invention.

As shown in FIG. 7B, a second-order high pass filter circuit 40 according to the fourth embodiment includes the op-amp AMP, the input terminal IN, the output terminal OUT, the terminal REF, the resistors R1, R2, the capacitors C1, Cs, and the blocks CSW1. A difference between the filter circuit 40 shown in FIG. 7B and a conventional second-order high pass filter circuit shown in FIG. 7A is in that the filter circuit 40 includes the blocks CSW1. One of the blocks CSW1 is connected to the capacitor C1 and the other of the blocks CSW1 is connected to the capacitor C2. Like the first embodiment, the op-amp AMP operates from the single power supply voltage +VDD.

Fifth Embodiment

Figure 8A:
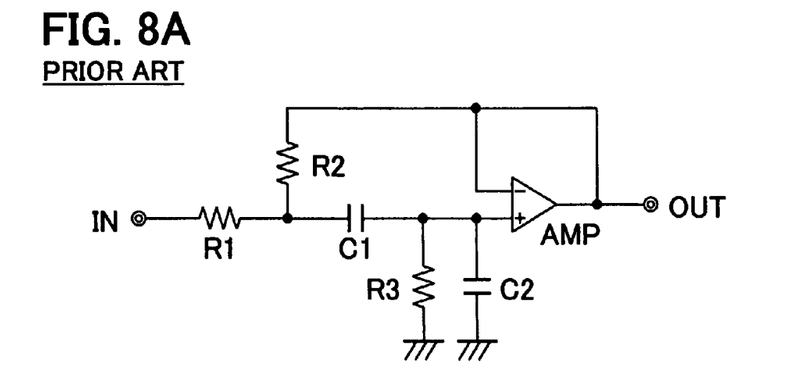
FIG. 8A is a schematic diagram of a conventional first-order band pass filter circuit.
Figure 8B:
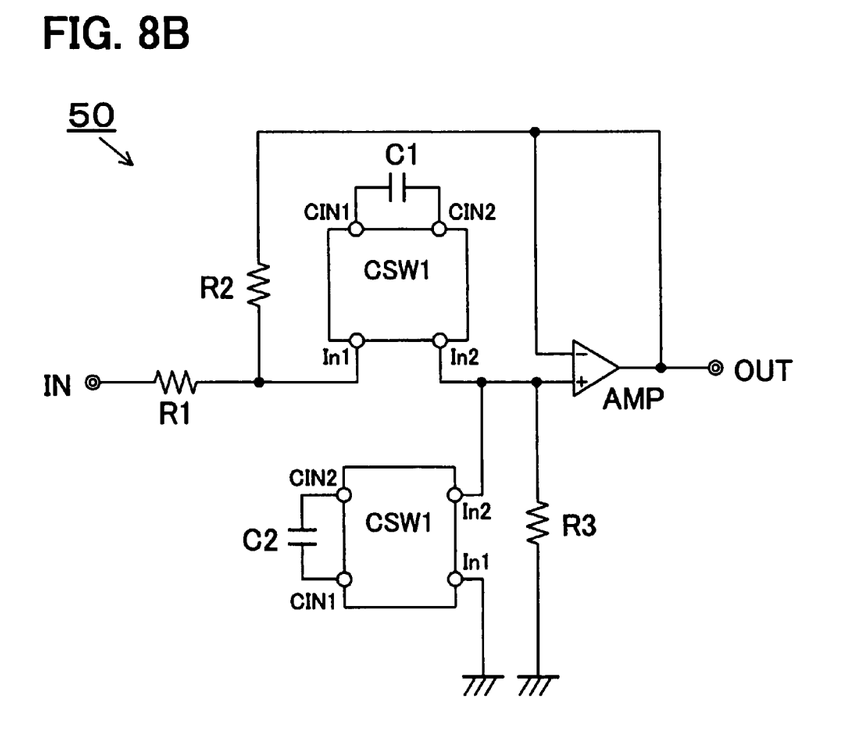
FIG. 8B is a schematic diagram of a first-order band pass filter circuit according to the fifth embodiment of the present invention.

As shown in FIG. 8B, a first-order band pass filter circuit 50 according to the fifth embodiment includes the op-amp AMP, the input terminal IN, the output terminal OUT, the terminal REF, the resistors R1, R2, the capacitors C1, Cs, and the blocks CSW1. A difference between the filter circuit 50 shown in FIG. 8B and a conventional first-order band pass filter circuit shown in FIG. 8A is in that the filter circuit 50 includes the blocks CSW1. One of the blocks CSW1 is connected to the capacitor C1 and the other of the blocks CSW1 is connected to the capacitor C2. Like the first embodiment, the op-amp AMP operates from the single power supply voltage +VDD.

Sixth Embodiment

Figure 9A:
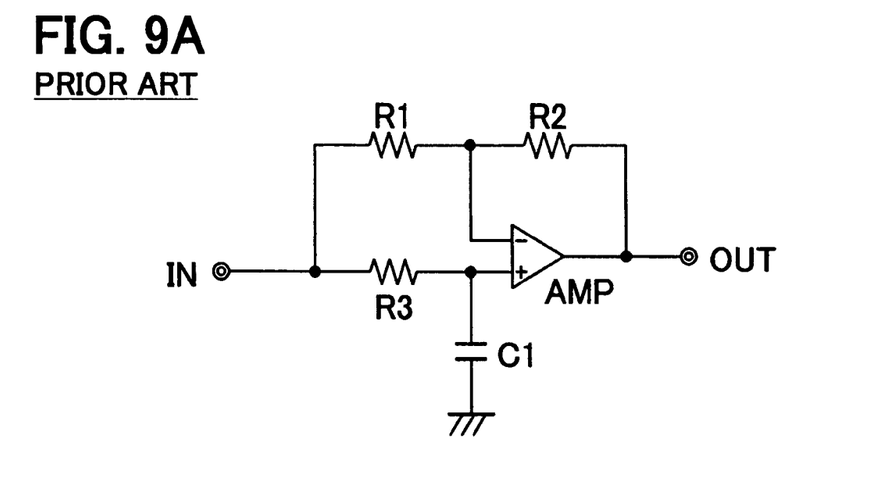
FIG. 9A is a schematic diagram of a conventional first-order all pass filter circuit with a high-frequency phase shift of 180°.
Figure 9B:
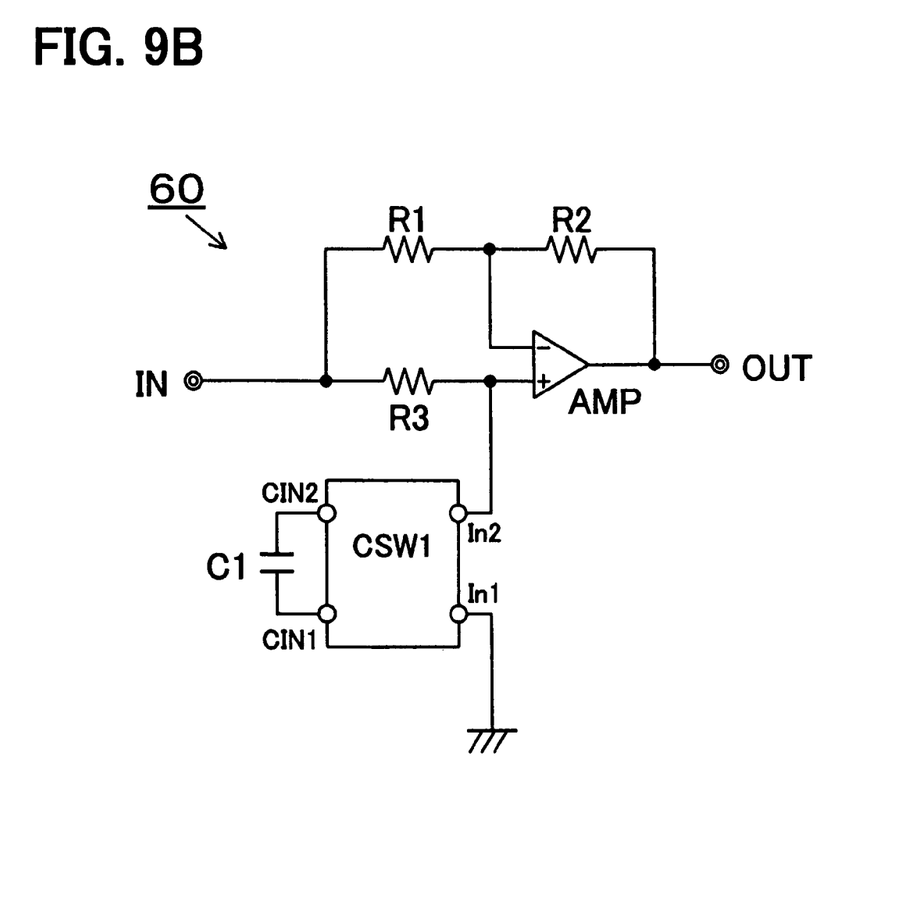
FIG. 9B is a schematic diagram of a first-order all pass filter circuit with a high-frequency phase shift of 180° according to the sixth embodiment of the present invention.

As shown in FIG. 9B, a first-order all pass filter circuit 60 with a high-frequency phase shift of 180° (i.e., phase inversion) according to the sixth embodiment includes the op-amp AMP, the input terminal IN, the output terminal OUT, the terminal REF, resistors R1-R3, the capacitor C1, and the block CSW1. A difference between the filter circuit 60 shown in FIG. 9B and a conventional first-order all pass filter circuit with a high-frequency phase shift of 180° shown in FIG. 9A is in that the filter circuit 60 includes the block CSW1 connected to the capacitor C1. Like the first embodiment, the op-amp AMP operates from the single power supply voltage +VDD.

Seventh Embodiment

Figure 10A:
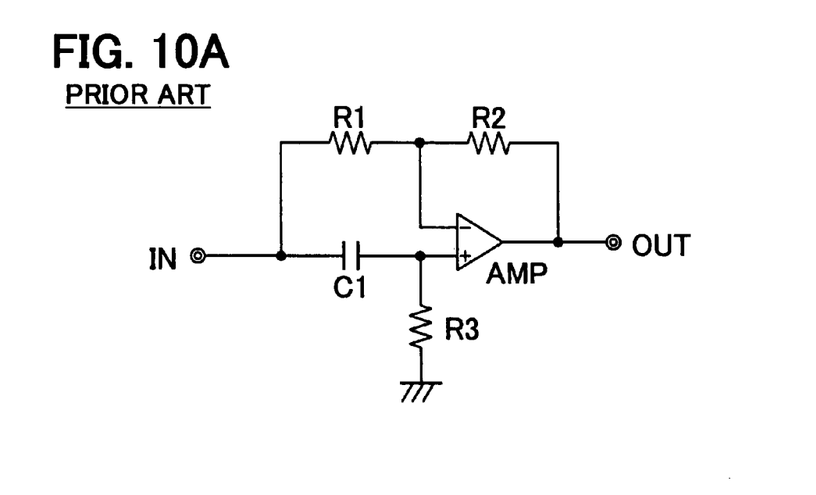
FIG. 10A is a schematic diagram of a conventional first-order all pass filter circuit with a low-frequency phase shift of 180°.
Figure 10B:
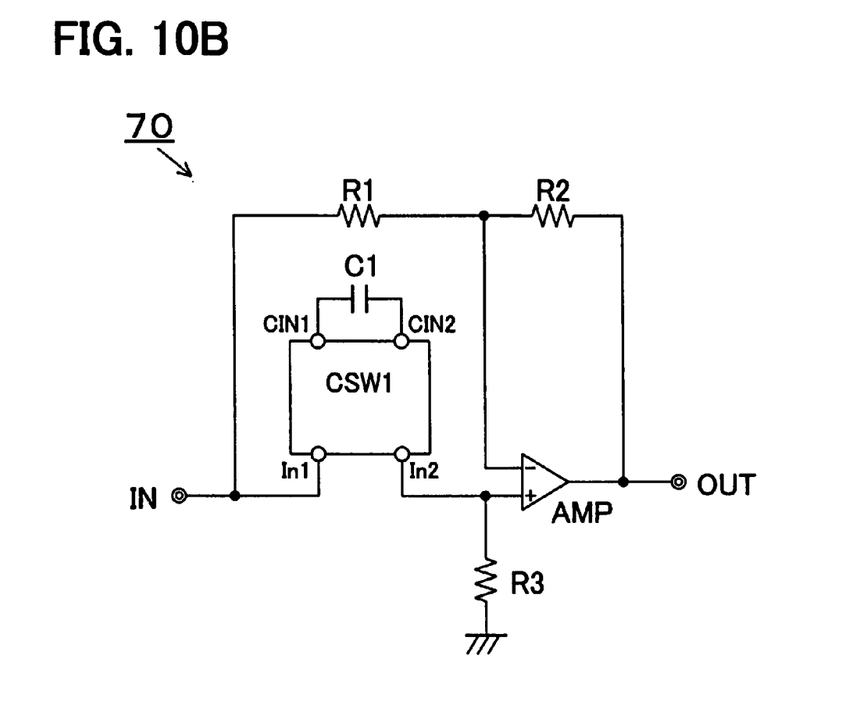
FIG. 10B is a schematic diagram of a first-order all pass filter circuit with a low-frequency phase shift of 180° according to the seventh embodiment of the present invention.

As shown in FIG. 10B, a first-order all pass filter circuit 70 with a low-frequency phase shift of 180° according to the seventh embodiment includes the op-amp AMP, the input terminal IN, the output terminal OUT, the terminal REF, the resistors R1-R3, the capacitor C1, and the block CSW1. A difference between the filter circuit 70 shown in FIG. 10B and a conventional first-order all pass filter circuit with a low-frequency phase shift of 180° shown in FIG. 10A is in that the filter circuit 70 includes the block CSW1 connected to the capacitor C1. Like the first embodiment, the op-amp AMP operates from the single power supply voltage +VDD.

Eighth Embodiment

Figure 11A:
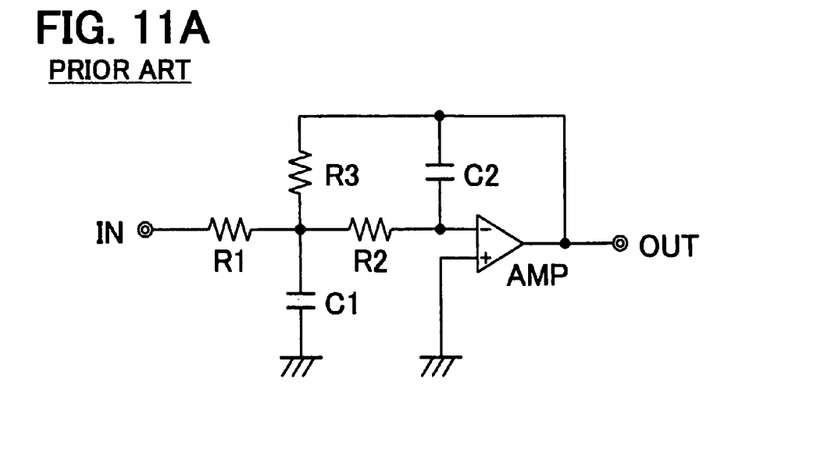
FIG. 11A is a schematic diagram of a conventional second-order low pass filter circuit with a phase shift of 180°.
Figure 11B:
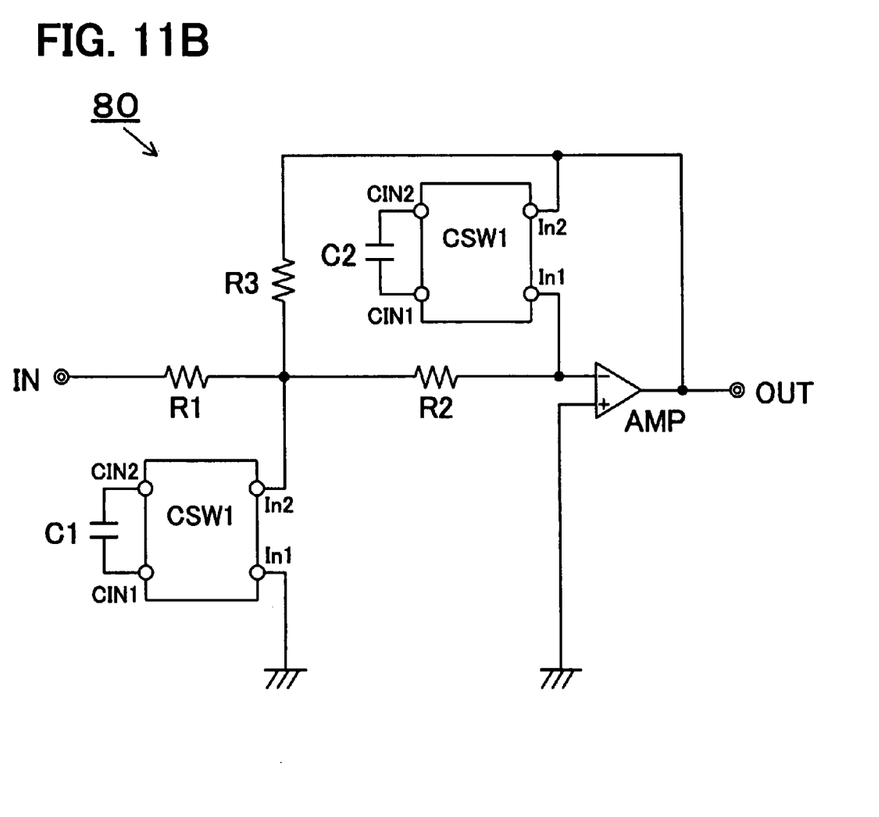
FIG. 11B is a schematic diagram of a second-order low pass filter circuit with a phase shift of 180° according to the eighth embodiment of the present invention.

As shown in FIG. 11B, a second-order low pass filter circuit 80 with a phase shift of 180° according to the eighth embodiment includes the op-amp AMP, the input terminal IN, the output terminal OUT, the terminal REF, the resistors R1-R3, the capacitors C1, C2, and the blocks CSW1. A difference between the filter circuit 80 shown in FIG. 11B and a conventional second-order low pass filter circuit with a phase shift of 180° shown in FIG. 11A is in that the filter circuit 80 includes the blocks CSW1. One of the blocks CSW1 is connected to the capacitor C1 and the other of the blocks CSW1 is connected to the capacitor C2. Like the first embodiment, the op-amp AMP operates from the single power supply voltage +VDD. A second-order high pass filter with a phase shift of 180° can be implemented in the same manner as the filter circuit 80.

Ninth Embodiment

Figure 12A:
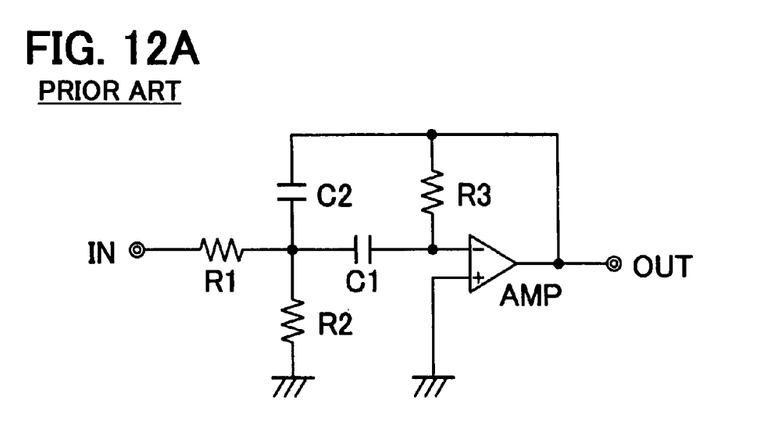
FIG. 12A is a schematic diagram of a conventional a first-order band pass filter circuit with a phase shift of 180°.
Figure 12B:
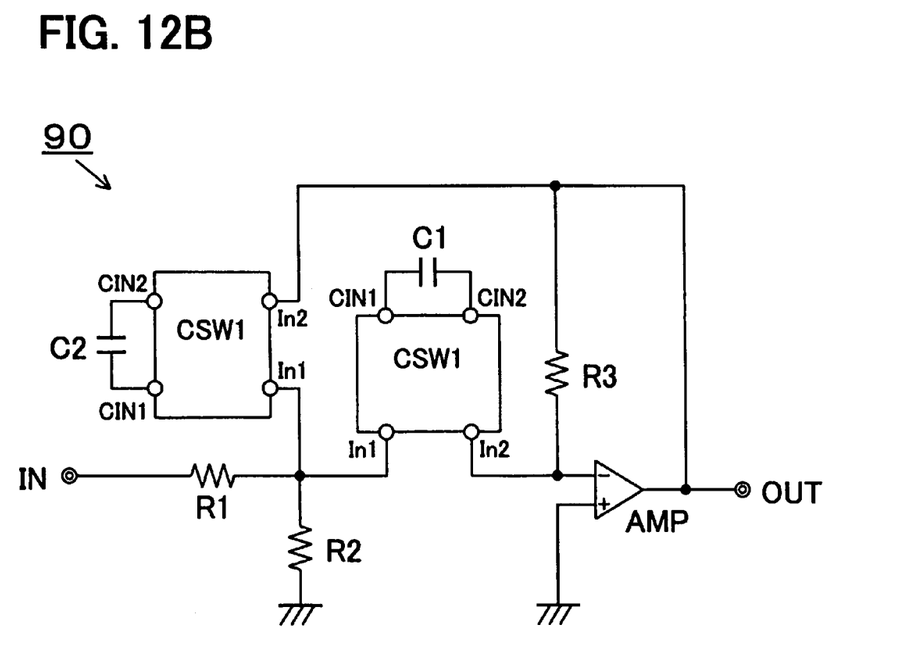
FIG. 12B is a schematic diagram of a first-order band pass filter circuit with a phase shift of 180° according to the ninth embodiment of the present invention.

As shown in FIG. 12B, a first-order band pass filter circuit 90 with a phase shift of 180° according to the ninth embodiment includes the op-amp AMP, the input terminal IN, the output terminal OUT, the terminal REF, the resistors R1-R3, the capacitors C1, C2, and the blocks CSW1. A difference between the filter circuit 90 shown in FIG. 12B and a conventional first-order band pass filter circuit with a phase shift of 180° shown in FIG. 12A is in that the filter circuit 90 includes the blocks CSW1. One of the blocks CSW1 is connected to the capacitor C1 and the other of the blocks CSW1 is connected to the capacitor C2. Like the first embodiment, the op-amp AMP operates from the single power supply voltage +VDD.

Tenth Embodiment

Figure 13:
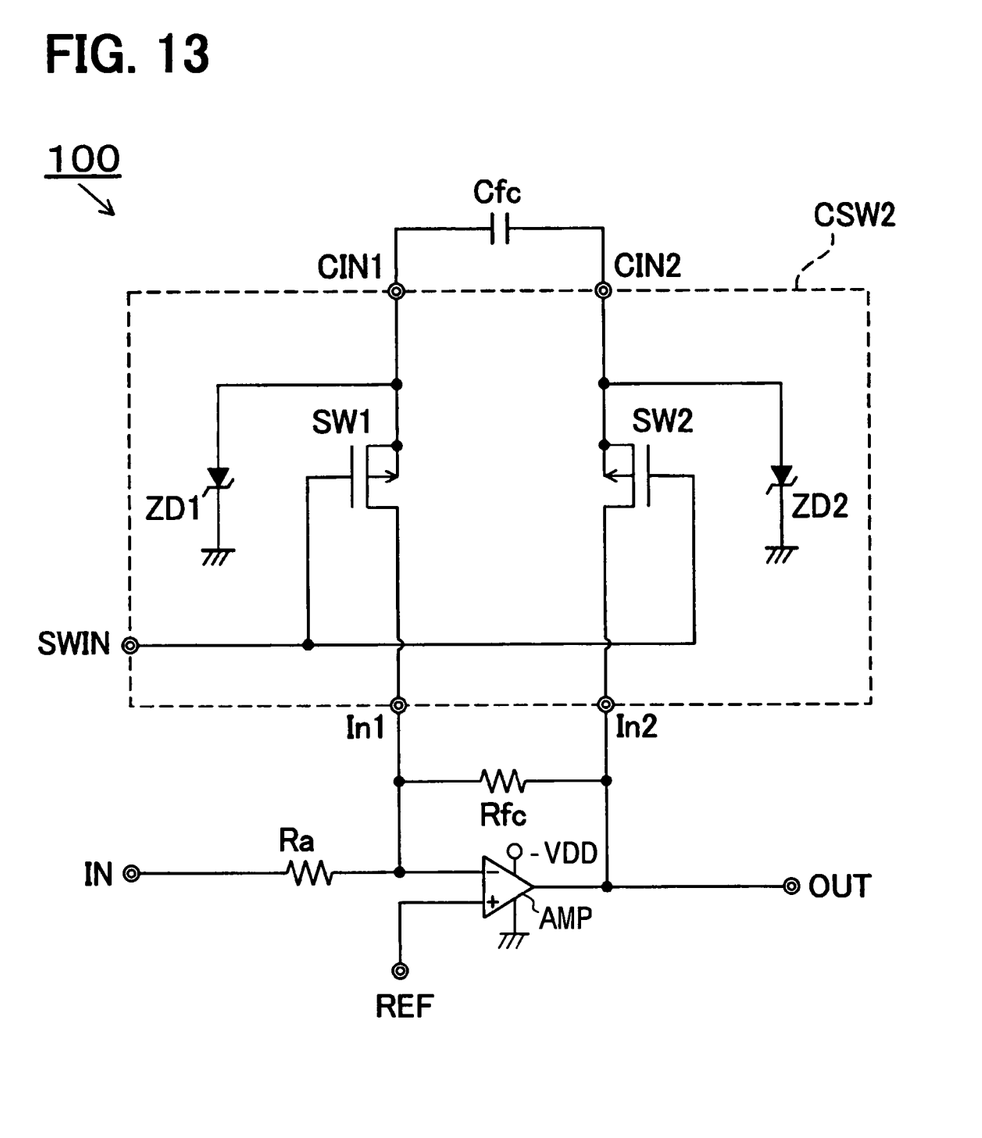
FIG. 13 is a schematic diagram of a first-order low pass filter circuit according to the tenth embodiment of the present invention.

As shown in FIG. 13B, a first-order low pass filter circuit 100 according to the tenth embodiment includes the op-amp AMP, the input terminal IN, the output terminal OUT, the terminal REF, the resistors Ra, Rfc, the capacitor Cfc, and a block CSW2. The block CSW2 includes two p-channel MOS transistors SW1, SW2, two zener diodes ZD1, ZD2, and five terminals CIN1, CIN2, In1, In2, and SWIN.

Differences between the filter circuit 100 shown in FIG. 13B and the filter circuit 10 shown in FIG. 1 are as follows. While the op-amp AMP of the filter circuit 10 is connected to the single positive power supply for providing the positive supply voltage +VDD with respect to ground, the op-amp AMP of the filter circuit 100 is connected to a single negative power supply for providing a negative supply voltage −VDD with respect to ground. While the midpoint voltage +VDD/2 equal to one half the supply voltage +VDD is applied to the terminal REF of the filter circuit 10, a midpoint voltage −VDD/2 equal to one half the supply voltage −VDD is applied to the terminal REF of the filter circuit 100. While the filter circuit 10 includes the block CSW1, the filter circuit 100 includes the block CSW2.

In the filter circuit 100 according to the tenth embodiment, each of the gates of the transistors SW1, SW2 is connected to the terminal SWIN. A control signal is applied to the terminal SWIN. When the control signal is low, each of the transistors SW1, SW2 is turned on. When the control signal is high, each of the transistors SW1, SW2 is turned off. Thus, each of the transistors SW1, SW2 acts as the switch that is tuned on and off in accordance with the level of the control signal.

The drain of the transistor SW1 is connected to the inverting input of the op-amp AMP through the terminal In1. The source of the transistor SW1 is connected to the anode of the zener diode ZD1 and connected to a first electrode of the capacitor Cfc through the terminal CIN1. The cathode of the zener diode ZD1 is connected to the ground. Thus, the zener diode ZD1 is connected between the source of the transistor SW1 and the ground in a forward biased manner.

In the transistor SW1, the n-type substrate body is connected to the source so that the body voltage is equal to the source voltage.

The drain of the transistor SW2 is connected to the output of the op-amp AMP through the terminal In2. The source of the transistor SW2 is connected to the anode of the zener diode ZD2 and connected to a second electrode of the capacitor Cfc through the terminal CIN2. Thus, the capacitor Cfc is connected between the sources of the transistors SW1, SW2. The cathode of the zener diode ZD2 is connected to the ground. Thus, the zener diode ZD2 is connected between the source of the transistor SW2 and the ground in the forward biased manner.

In the transistor SW2, the n-type substrate body is connected to the source so that the body voltage is equal to the source voltage.

In the filter circuit 100 according to the tenth embodiment, the zener diode ZD1 is connected between the source of the transistor SW1 and the ground in the forward biased manner. Thus, the source voltage (i.e., the voltage of the terminal CIN1) of the transistor SW1 is clamped to the zener voltage of the zener diode ZD1. Also, the zener diode ZD2 is connected between the drain of the transistor SW2 and the ground in the forward biased manner. Thus, the source voltage (i.e., the voltage of the terminal CIN2) of the transistor SW2 is clamped to the zener voltage of the zener diode ZD2. In such an approach, even when the capacitor Cfc is overcharged, the source voltages of the transistors SW1, SW2 are clamped to the zener voltages of the zener diodes ZD1, ZD2, respectively. Thus, the zener diodes ZD1, ZD2 protect the transistors SW1, SW2 from being destroyed by excessive voltage.

In the filter circuit 10 according to the first embodiment, the op-amp AMP operates from the negative single supply voltage −VDD. Therefore, it is preferable that p-channel transistors are used as the transistors SW1, SW2. If n-channel transistors are used as the transistors SW1, SW2, the discharging current flows out of the capacitor Cfc even when the transistors SW1, SW2 are turned off.

MODIFICATIONS

The embodiment described above may be modified in various ways. For example, if the capacitors Cfc, C1, C2 have a large capacitance, the filter circuit excluding the capacitors Cfc, C1, C2 may be integrated on one semiconductor chip as the monolithic IC. The capacitors Cfc, C1, C2 are externally connected to the monolithic IC. In such an approach, the monolithic IC can be compact. Other voltage level than the midpoint voltage can be applied to the inverting input of the op-amp AMP through the terminal REF. For example, the ground voltage may be applied to the inverting input of the op-amp AMP.

The op-amp AMP can operate from a dual power supply. The filter circuit may include a voltage amplifier circuit other than the op-amp. The filter circuit may include a clamp circuit other than the zener diode.

In the second to ninth embodiments, the op-amp AMP may operate from the negative power supply −VDD. In this case, the block CSW1 is replaced with the block CSW2.

Such changes and modifications are to be understood as being within the scope of the present invention as defined by the appended claims.

What is claimed is:

1. An active filter circuit comprising:
   an active circuit including a voltage amplifier, an associated voltage amplifier power supply and a resistor connected to the voltage amplifier;
   a capacitor having a first electrode and a second electrode;
   a first analog switch connected between the first electrode and the active circuit and for receiving a switching control signal; and
   a second analog switch connected between the second electrode and the active circuit and for receiving the switching control signal, wherein
   each of the first and second analog switches is opened by the switching control signal when the associated voltage amplifier power supply supplies a supply voltage to the voltage amplifier and the voltage amplifier is turned on, is closed by the switching control signal when an output voltage of the voltage amplifier reaches a predetermined steady state value, and is opened by the switching control signal when the supply voltage from the associated voltage amplifier power supply to the voltage amplifier is interrupted and the voltage amplifier is turned off.

2. The filter circuit according to claim 1, further comprising:
   a first clamp circuit for clamping a voltage at a node between the first electrode of the capacitor and the active circuit to a first predetermined voltage, and
   a second clamp circuit for clamping a voltage at a node between the second electrode of the capacitor and the active circuit to a second predetermined voltage.

3. The filter circuit according to claim 2, wherein
   each of the first and second clamp circuits is a zener diode, and
   each of the first and second predetermined voltage is a zener voltage of the zener diode.

4. The filter circuit according to claim 1, wherein
   the voltage amplifier operates from a positive power supply, and
   each of the first and second analog switches is a n-channel MOS transistor.

5. The filter circuit according to claim 1, wherein
   the voltage amplifier operates from a negative power supply, and
   each of the first and second analog switches is a p-channel MOS transistor.

6. The filter circuit according to claim 1, wherein
   the voltage amplifier is an operational amplifier.

7. The filter circuit according to claim 1, wherein
   the filter circuit is one of a first-order low pass filter circuit, a first-order high pass filter circuit, a second-order low pass filter circuit, a second-order high pass filter circuit, a first-order band pass filter circuit, a first-order all pass filter circuit with a high-frequency phase shift of 180°, a first-order all pass filter circuit with a low-frequency phase shift of 180°, a second-order low pass filter circuit with a phase shift of 180°, a second-order high pass filter circuit with a phase shift of 180°, and a first-order band pass filter circuit with a phase shift of 180°.

8. The filter circuit according to claim 1, wherein
   the resistor, the voltage amplifier, the capacitor, and the first and second analog switches are integrated on one semiconductor chip.

* * * * *